Figure 1:
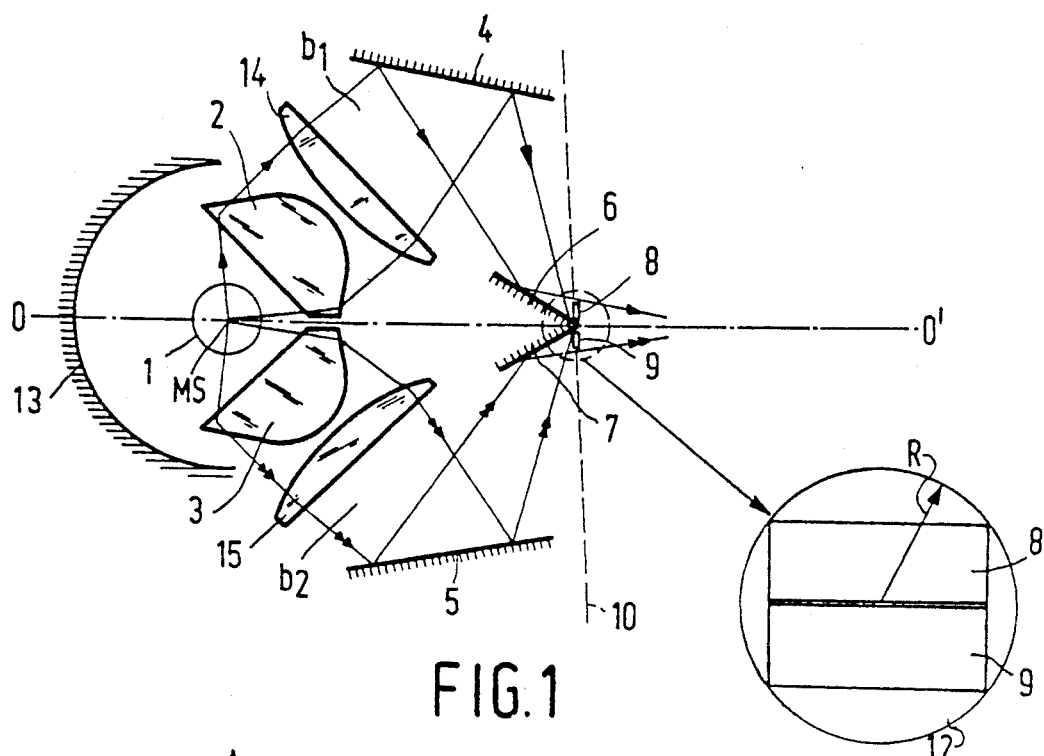

United States Patent [19]

Stroomer et al.

[11] Patent Number: 5,046,837
[45] Date of Patent: Sep. 10, 1991

[54] ILLUMINATION SYSTEM

[75] Inventors: Martinus V. C. Stroomer; Wilhelmus A. C. Timmers, both of Eindhoven, Netherlands

[73] Assignee: U.S. Philips Corporation, New York, N.Y.

[21] Appl. No.: 318,090

[22] Filed: Mar. 2, 1989

[30] Foreign Application Priority Data

May 26, 1988 [NL] Netherlands .......................... 8801348

[51] Int. Cl.⁵ .................... F21V 13/04; G03B 21/28
[52] U.S. Cl. ........................................ 353/82; 353/34; 353/99; 362/297
[58] Field of Search ........................ 353/30, 31, 32, 34, 353/98, 99, 82, 122; 362/263, 268, 297, 298, 301

[56] References Cited

U.S. PATENT DOCUMENTS

| | | | |
|---|---|---|---|
| 2,858,731 | 11/1958 | Rehorn | 353/82 |
| 3,457,401 | 7/1969 | Hoekstra | 353/82 |
| 4,127,322 | 11/1978 | Jacobson et al. | 353/34 |
| 4,206,494 | 6/1980 | Lovering | 362/263 |
| 4,567,551 | 1/1986 | Choate | 362/268 |
| 4,642,740 | 2/1987 | True | 362/268 |

Primary Examiner—Harry N. Haroian

[57] ABSTRACT

A low-throughput illumination system is described, comprising a radiation source (1), a plurality of condensors (2, 14; 3, 15) for forming a plurality of beams ($b_1$, $b_2$) from the radiation supplied by the source and a first reflector (4, 5) for each beam, which reflectors direct the beam towards the principal axis (00'). The system comprises second reflectors (6, 7) which deflect the beams in the direction of the principal axis so that the beams have their narrowest constrictions (8, 9) in the exit plane (10) and are located close together.

10 Claims, 3 Drawing Sheets

ILLUMINATION SYSTEM

The invention relates to a low-throughput illumination system which behaves as a radiation source emitting a radiation beam along a principal axis, said system comprising a radiation source, a condensor system arranged around the radiation source for receiving the source radiation from different directions and for forming a plurality of radiation beams, a first reflector being arranged in the path of each beam for reflecting the relevant beam towards the principal axis. The invention also relates to a projection television system comprising such an illumination system.

U.S. Pat. No. 4,206,494 describes an illumination system for use in a device for projecting circuit patterns, or IC masks, on a wafer of semiconductor material for the manufacture of integrated circuits. Since this device is a production device, the exposure times for the semiconductor wafers must be as short as possible so as to minimize the feedthrough time of such a wafer through the device. The projection beam must therefore have a high intensity. Increasing the intensity of the radiation source, for example, a high-pressure mercury lamp provides only limited advantages. In fact, lamps supplying a higher radiation energy also have a larger radiating surface in the form of a lamp arc or filament so that the exit aperture of the illumination system becomes larger. If this aperture were reduced, a part of the radiation energy would be lost again. It is therefore desirable to receive the maximum possible radiation energy from the source and to concentrate it in a narrow beam.

This is also desirable in an illumination system in a projection television device in which so-called liquid crystal display panels are used for generating pictures Which are projected on a screen Via a projection lens system. When used in transmission, these display panels have a low efficiency: for example, only 10% of the radiation incident on the panel is passed on to the projection lens system. Moreover, this lens system images the panel with magnification so that the illumination beam must have a large intensity to ensure sufficient light intensity per surface unit on the screen. Since a projection television device is a consumer device which, rather than a professional device such as an IC mask projection device, should be as simple and inexpensive as possible, the simplest possible cooling of the radiation source should suffice so that the radiation energy of this source should remain limited and this energy should be used as efficiently as possible.

To meet the requirement of concentrating the maximum possible radiation energy of a radiation source in a narrow beam, preferably with a circular cross-section, U.S. Pat. No. 4,206,494 proposes to arrange at least three and preferably four condensor lenses around the elongate radiation source whose longitudinal direction coincides with the principal axis of the system. The beams constituted by there condensors are reflected by reflectors to the entrance faces of a like number of fibre bundles disposed around the principal axis. The fibre bundles terminate in a common exit fibre bundle whose exit face functions as a secondary radiation source. The complex fibre system is difficult to manufacture and too expensive for a consumer device.

The present invention has for its object to provide a simpler and less expensive illumination system which has also such a low throughput that the optical elements of the device in which the illumination system must be used may also be simple and inexpensive.

To this end the illumination system according to the invention includes a second reflector for deflecting a beam axis towards the principal axis, arranged in the radiation path of each beam at the location where the beams would intersect one another, so that the beams have their narrowest constriction in the exit plane of the system located proximate to the second reflectors, are separated from one another, and are in principle located symmetrically with respect to the principal axis.

In this device the radiation of, for example an elongate lamp is concentrated in a number N, corresponding to the number of condensors, of magnified images of the lamp all of which images are located within a circular region around the principal axis whose radius is smaller than N times the radius of the described circle of the radiation source image. Therefore, a large part of the energy of the source is concentrated within a small exit aperture of the illumination system. Moreover, the angular apertures of the beams with which the secondary sources are formed are relatively small. This means that the illumination system has a low throughput. The term "throughput", or "luminosity" or "acceptance" characterizes the power of an optical system to transport radiation energy. This power is determined by the combination of an aperture or "stop" and the pupil in the same location in the optical system and can be expressed by the product of the surface of the aperture and the solid angle subtended by the pupil in the centre of the aperture. In an optical system having a given throughput at the entrance, the throughput further down the system can only be reduced by blocking radiation.

The illumination system according to the invention has the advantage that its low throughput obviates the use of expensive optical elements, having for example large numerical apertures or large cross-sections, in the device in which the illumination system must be used, which is particularly important for consumer devices.

The device according to the invention is preferably further characterized in that a lens is arranged at the exit of the illumination system for converging the beam axes in a point on a surface which must be illuminated and for superimposed imaging of the pupils of the condensors on said surface. Consequently, the radiation coming from the separate secondary radiation sources is transferred in an optimum manner to the surface to be illuminated.

The throughput of the illumination system is dependent on the sire of the radiating surface, such as the light arc of a lamp and on the angular aperture of the beam received by a condensor. The said radiating surface must be preferably as small as possible. If a large portion of the spatial angle in which the source emits radiation must be covered with a minimum number of condensors, each condensor must have a relatively large numerical aperture. In the case of two condensors this numerical aperture is, for example of the order of 0.7. In connection therewith the illumination system according to the invention is preferably characterized in that each condensor comprises a single lens element at least one refractive surface of which is aspherical.

An aspherical lens surface is a surface whose fundamental shape is spherical but whose profile may deviate from the sphericity so as to correct for aberrations of the fundamental shape of the lens. This asphericity provides the possibility of using one lens element where otherwise one or more extra correction lens elements would be required in connection with the required large numerical aperture.

The illumination system according to the invention may be further characterized in that each aspherical condensor lens element is succeeded by at least one extra lens element. The extra lens elements may take over a part of the required correction or lens power of the condensor element so that the last-mentioned element can be manufactured in a simpler manner and may be less expensive. This is particularly important if the condensor lens must have a large numerical aperture. If a portion of the power of the condensor system is disposed in the extra lens elements, these elements may be aspherical. The extra lens elements may be alternatively, for example Fresnel lenses which have the advantage of being thin and light.

In connection with the use of the illumination system in a device, for example a projection device with a given distance between the exit plane of the system and a liquid crystal display panel, which panel must be adequately filled with radiation and in which the lamp envelope and consequently the condensor diameter cannot be very small, it may be necessary for the beams in the illumination system to traverse a relatively long optical path. To limit the length of the illumination system, this system may be further characterized in that at least one further reflector is arranged in each of the beams between the first and the second reflector. The radiation path of the related beams is folded by this extra reflector. If the radiation path is to be folded even further, fourth, fifth, etc. reflectors may be used.

A first embodiment of the illumination system according to the invention is further characterized in that two condensors are arranged on the front side of the radiation source facing the exit of the system, the optical axes of said condensors intersecting each other in the centre of the radiation source at an angle which is smaller than 90°, in that a concave reflector is arranged on the rear side of the radiation source, which reflector reflects the radiation emerging from the rear side of the radiation source towards the condensors, in that the second reflectors combined constitute a roof mirror having an apex angle which is smaller than 90° and whose apex faces the exit of the illumination system, and in that the cross-sections in the system exit plane of the beams formed by the condensors and the reflectors are located on different sides of a plane through the optical axis and transversely to the longitudinal direction of the radiation source.

A second embodiment of the illumination system is characterized in that the condensor system is constituted by four condensors which are arranged symmetrically around the radiation source, the optical axes of said condensors intersecting one another in the centre of the radiation source, in that the second reflectors combined constitute a pyramid-shaped mirror and in that the cross-sections in the exit plane of the system of the four beams formed by the condensors and the reflectors are located in four different quadrants of the exit plane.

A third embodiment of the illumination system is further characterized in that the condensor system is constituted by a continuum of lenses surrounding the radiation source, which lenses combined constitute an annular lens supplying a continuum of radiation beams together forming an annular radiation beam, in that the first and second reflectors constitute a first and a second cone-shaped reflector, respectively, and in that the beam formed by the annular lens and the reflectors has an annular cross-section at the area of the exit plane, which cross-section is centred with respect to the principal axis.

The invention can be used to great advantage in a projection device successively comprising an illumination system, an information display system with at least one display panel for generating images to be projected and a projection lens system for projecting these images on a screen. This device is characterized in that the illumination system is one of the above-mentioned systems and comprises an output lens for superimposed imaging of the pupils of the condensors of the illumination system on the information display panels.

The invention can also be used in other devices in which it is advantageous to have an illumination beam with a high intensity and a low throughput. An example is a device for illuminating a semiconductor substrate by means of a mask pattern for the manufacture of integrated circuits, a photo enlarger, a slide or film projector, etc.

An embodiment of a projection television device comprising the said illumination system and being important in practice is a colour projection device having three colour channels for the three primary colours red, green and blue, each colour channel comprising a separate display panel. This device is characterized in that it comprises one illumination system according to the invention for supplying separate beams for the three colour channels via colour-splitting means.

Figure 2:
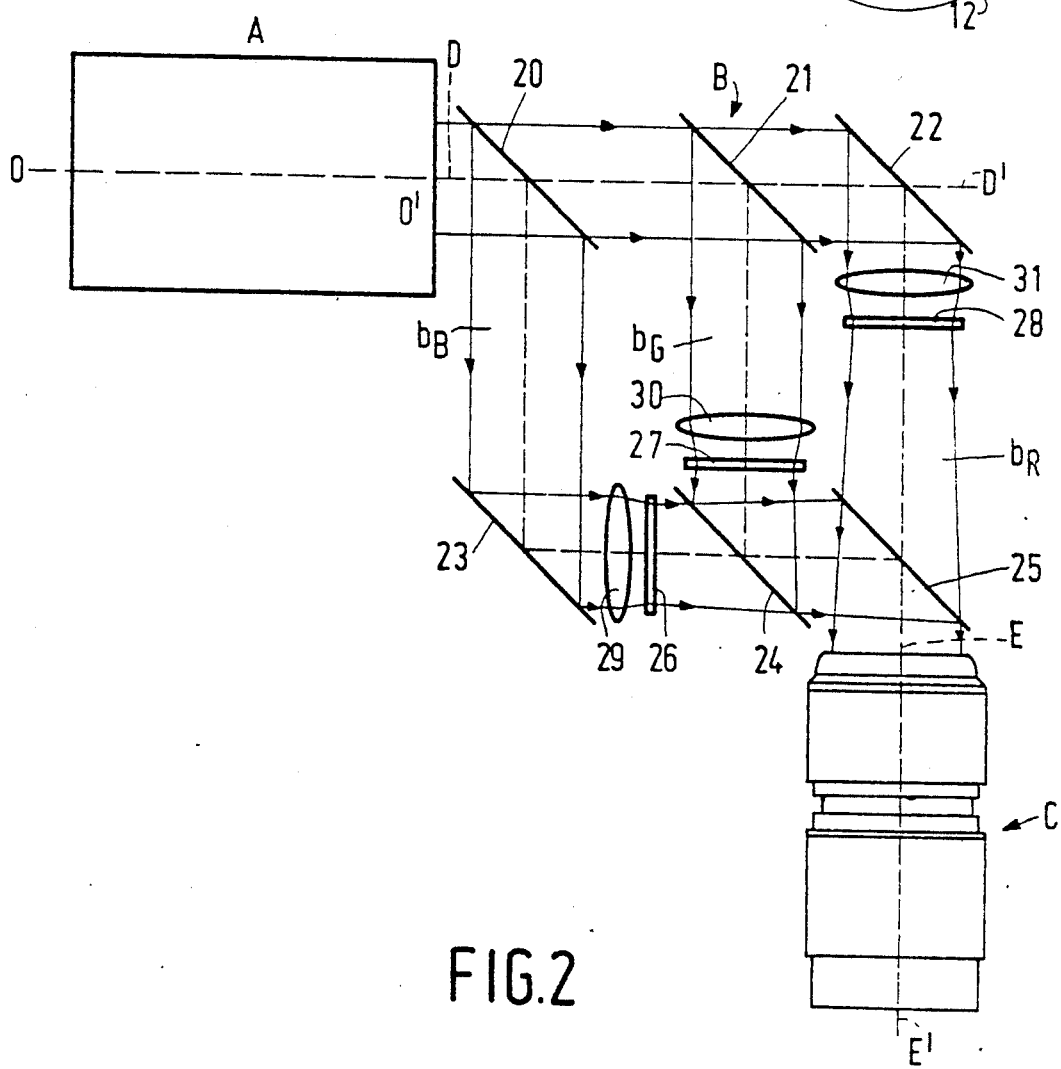
Figure 3:
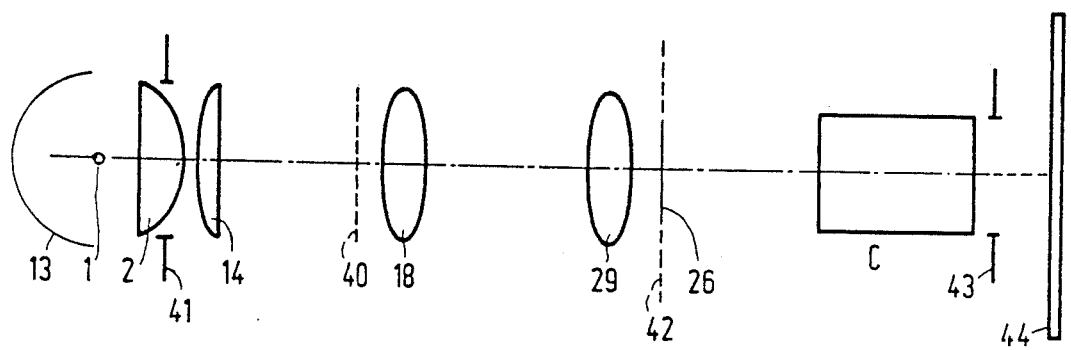
Figure 4:
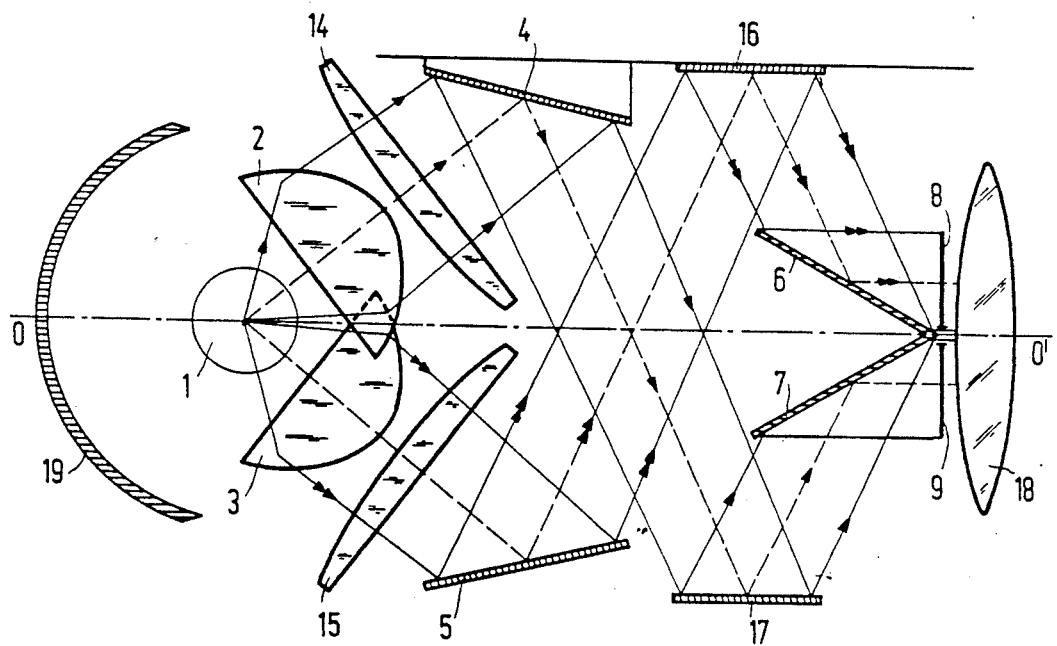
Figure 5:
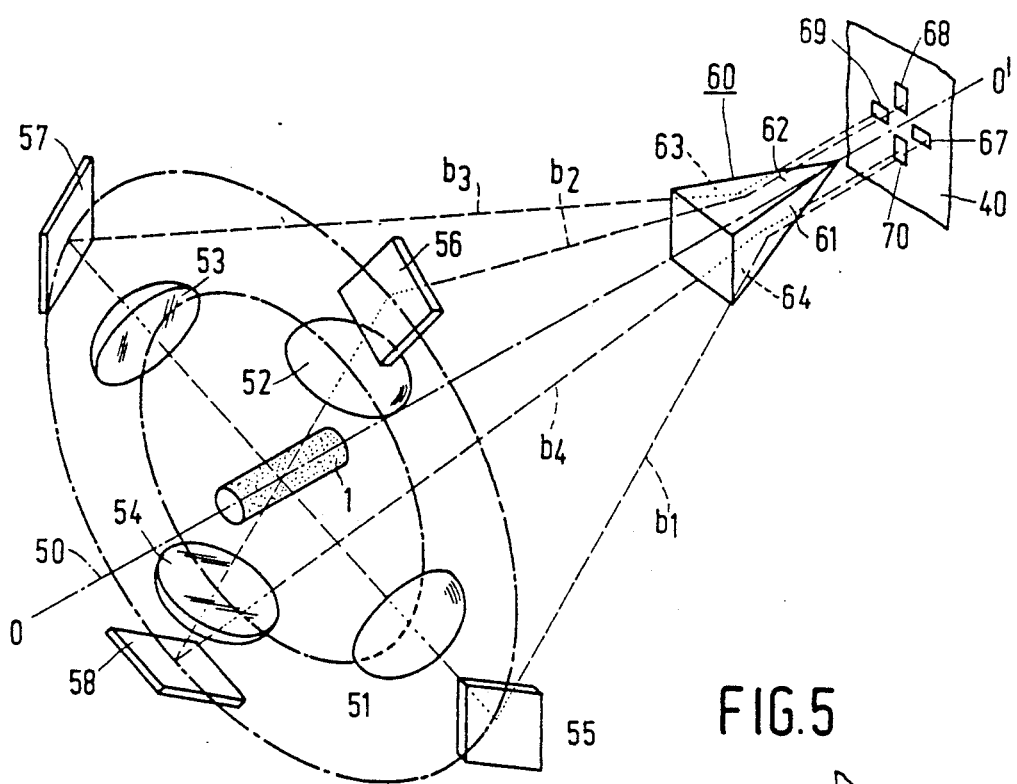
Figure 6:
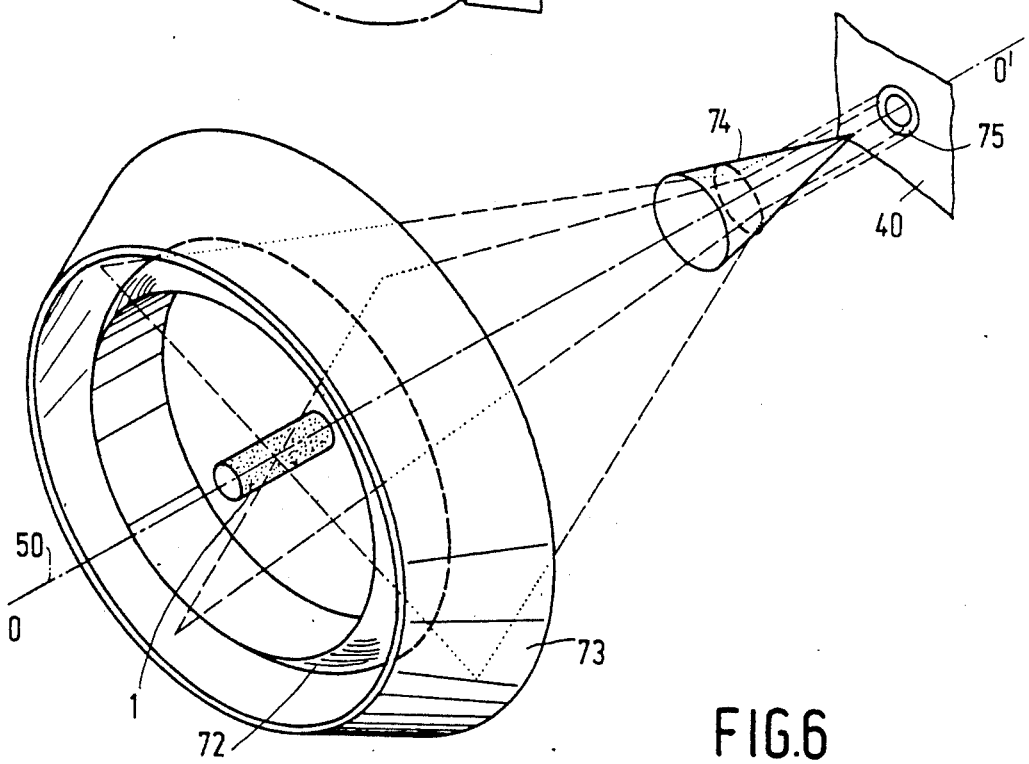

The invention will now be described in greater detail, by way of example, with reference to the accompanying drawings in which FIG. 1 is a first embodiment of the illumination system according to the invention, FIG. 2 shows a colour projection television device comprising such an illumination system, FIG. 3 shows diagrammatically the optical path traversed by one of the beams from the source to the projection screen, FIGS. 4, 5 and 6 are second, third and fourth embodiments of the illumination system.

In the illumination system of FIG. 1 two condensor lenses 2 and 3 are arranged on the front side of a radiation source 1. This radiation source, with the centre $M_s$ is, for example a metal halide lamp which is elongate and has a length-width ratio of, for example 2:1. The longitudinal direction of the lamp is perpendicular to the optical axis $OO'$. The radiation received by the condensors is bundled into two subbeams $b_1$ and $b_2$ which are reflected by first reflectors, or mirrors 4 and 5 towards the principal axis. Second reflectors 6 and 7 constituting a roof mirror are arranged on either side of the principal axis $OO'$ in a position where the beams would intersect each other and where the beam cross-sections are already small. These reflectors deflect the beams in the direction of the principal axis. The beams have their narrowest constriction in the exit plane 10 of the illumination system. It can be stated that two secondary radiation sources 8 and 9 having a small radiating surface are arranged in this plane.

The inset in FIG. 1 shows these radiation sources, or lamp images 8 and 9 in a front view. If the lamp 1 has a radiating surface of, for example $6 \times 3$ mm$^2$, the surfaces 8 and 9 are of course also $6 \times 3$ mm$^2$, reckoned back to the position of the lamp. The circle 12 within which the images of the lamp are located then has a radius R of approximately 4.2 mm. Thus it holds that the two lamp images are formed within a circular region whose radius is smaller than twice the radius of the described circle of the radiating lamp surface so that the radiation of the lamp received by the condensors is concentrated in a beam having a small cross-section.

A concave reflector 13 reflecting the radiation emitted from the rear side of the source to the condensors 2 and 3 is preferably arranged behind the radiation source, so that also this radiation can contribute to the intensity of the beams $b_1$ and $b_2$ and thus enhances the efficiency of the illumination system.

The condensors must have a large numerical aperture, for example of the order of 0.7 to be able to receive sufficient radiation from the source. These condensors may be formed by single lens elements 2 and 3 which have aspherical surfaces so that they are sufficiently corrected for the envisaged object. The requirements imposed on the lens elements 2 and 3 may be alleviated if additional lens elements, such as the elements 14 or 15, and possibly more lens elements are added to the elements 2 and 3. The additional lens elements may supply a part of the required correction for the lens elements 2 and 3 and they may be, for example aspherical. It is alternatively possible for a part of the required power of the condensors to be built in one or more additional lens elements. The additional lens elements may not only consist of elements having curved refractive surfaces, but also of thin and light Fresnel lens elements or of lens elements having a radially varying refractive index.

The illumination system is adapted to be such that, viewing back from the exit plane 10, the pupils of the condensor systems 2, 14 and 3, 15 are superimposed on the principal axis 00', which pupils extend at opposite angles to the principal axis. At the location of the roof mirror the axes of the beams $b_1$ and $b_2$ extend at opposite and small angles to the principal axis 00'. The roof mirror eliminates a par of the divergence between the beam axes.

The lamp images 8 and 9 are preferably located symmetrically with respect to the principal axis 00' but small deviations from these positions are admissible.

FIG. 2 shows diagrammatically an embodiment of a colour projection television device. This device comprises three main sections: the illumination system A, the picture display system B and a projection lens system, for example a room lens C. The principal axis 00' of the illumination system is in alignment with the optical axis DD' which in the embodiment shown is firstly divided into three sub-axes for colour projection, which sub-axes are later combined again to one optical axis coinciding with the optical axis EE' of the projection lens system.

The beam from the illumination system A is incident on a colour-selective reflector 20, for example a dichroic mirror which reflects, for example the blue colour component $b_B$ and passes the rest of the beam. This beam portion encounters a second colour-selective reflector 21 which reflects the green colour component $b_G$ and passes the remaining red colour component $b_R$ to a reflector 22 which reflects the red beam to the projection lens system. The reflector 22 may be a neutral reflector or a reflector which is optimized for red light. The blue beam is reflected by a neutral or blue-selective reflector 23 to a display panel 26 in the form of a liquid crystal panel. This panel is electronically driven in known manner so that the blue component of the image to be projected appears on this panel. The beam modulated with the blue information reaches the projection lens system C via a colour-selective reflector 24 which passes the blue beam and reflects the green beam and a further colour-selective reflector 25 which reflects the blue beam. The green beam $b_G$ traverses a second display panel 27 where it is modulated with the green picture component and is then reflected to the projection lens system C successively by the colour-selective reflectors 24 and 25. The red beam $b_R$ traverses a third display pane) 28 where it is modulated with the red picture component and subsequently reaches the projection lens system via the colour-selective reflector 25.

The blue, red and green beams are superimposed at the entrance of this lens system so that a colour picture is created which is imaged in a magnified form by this system on a projection screen not shown in FIG. 2.

The optical path lengths between the exit of the illumination system A and each of the display panels 26, 27 and 28 are preferably equal so that the cross-sections of the beams $b_B$, $b_G$ and $b_R$ are equal at the area of their display panel. Also the optical path lengths between the display panels 26, 27 and 28 and the entrance aperture of the projection lens system are preferably equal so that the differently coloured scenes are satisfactorily superimposed on the projection screen.

Additional lenses 29, 30 and 31 ensuring that all radiation from the exit plane of the illumination system is concentrated in the entrance pupil of the projection lens system L may be arranged in front of the display panels 26, 27 and 28.

In order to couple the radiation concentrated in the images, or secondary sources 8 and 9 as efficiently as possible in the projection device and in order to image the pupils of the condensors in a superimposed manner on the display panels, a lens is aranged at the exit of the illumination system, as is denoted by the reference numeral 18 in FIG. 3. This Figure shows diagrammatically the different optical elements which are traversed by a colour component of one of the beams of the illumination system from the radiation source to the projection screen 44. The reflecting elements traversed by the beam component are of course not shown in FIG. 3. The plane in which the images of the radiation source 1 are formed by the condensor system 2, 14 is denoted by the reference numeral 40. Behind this plane there is arranged the output lens 18 which images the pupil 41 of the condensor system 2, 14 in a plane 42. A display panel 26 which is imaged by the projection lens system C on the projection screen 44 is arranged in this plane.

Throughout the device the radiation source images and their reproduced images are separated. The reproduced images formed in the device on the display panels and on the projection screen of the pupils of the condensors are superimposed.

It is to be noted with reference to FIG. 2 that it shows only one possible embodiment of the picture display system B. The illumination system according to the invention may be combined with numerous other picture display systems. The colour splitting and combination may alternatively be effected with, for example compact composite colour-splitting prisms instead of with separate dichroic mirrors. A colour picture projection may also be realized by means of only one panel which establishes a colour splitting itself and which is irradiated by a beam of white light. The invention may of course also be used in a projection device for only one colour, comprising only one display panel. In addition to a television image, other information such as graphic information or numerical information may be projected. Moreover, the use of the invention is not limited to a projection device. The invention may be used in any optical device in which a high illumination level is desired and in which the illumination beam must have a low throughput.

In order to illuminate a surface of an object, for example a display panel in an adequate manner, a given convergence of the illumination beam, determined by the construction of the device, may require this beam to traverse a relatively long optical path length in the illumination system. In order to limit the length of the illumination system in such a case, as is shown in the embodiment of FIG. 4, third reflectors 16 and 17 may be arranged between the first reflectors 4 and 5 and the second reflectors 6 and 7. The reflectors 16 and 17 fold the optical path, so that the illumination system can be accommodated in a holder of limited length. It is of course possible to arrange more reflectors in the radiation paths of the beams $b_1$ and $b_2$ if these paths are to be folded still further. FIG. 4 also shows the lens 18 which images the pupils of the condensor systems 2, 14 and 3, 15 on the surface to be illuminated.

FIG. 5 is a perspective view of an embodiment of the illumination system in which four condensors 51, 52, 53 and 54 are arranged symmetrically around the radiation source. These condensors constitute four radiation beams $b_1$, $b_2$, $b_3$ and $b_4$ of which only the chief rays are shown which beams are incident on reflectors 55, 56, 57 and 58 arranged at an angle of less than 45° to the longitudinal direction 50 of the source 1. The four beams are then reflected with their chief rays converging in the direction of the principal axis 00'. Subsequently, these beams are incident on a pyramid-shaped reflector 60 having four reflecting faces 61, 62, 63 and 64 whose apex faces the exit of the illumination system. Each beam $b_1$, $b_2$, $b_3$ and $b_4$ is reflected by a separate reflector face 61, 62, 63 and 64 and is directed towards the exit of the illumination system. The cross-sections 67, 68, 69 and 70 of these beams in the exit plane 40 are then grouped around the principal axis 00', as is shown in FIG. 5. For the sake of clarity the exit plane 40 in FIG. 5 is shown at some distance from the apex of the reflector 60. This plane is actually close to the apex of the element 60.

The condensor system may also comprise more than four condensors which are smaller and can be arranged closer together in the proximity of the radiation source. This division may be continued until all condensor lenses merge with one another and together constitute an annular lens. An embodiment of the illumination system with such a lens is shown in a perspective view in FIG. 6. The annular lens 72 may be an aspherical lens. An annular reflector 73 whose reflecting face is arranged at an angle of less than 45° to the longitudinal direction 50 of the source 1 surrounds this lens. This face is thus a part of a cone. The annular beam formed by the lens 72 is incident on a cone-shaped reflector 74 which deflects the beam in the direction of the principal axis 00'. In the exit plane of the illumination system this beam has an annular cross-section 75. In the embodiment of FIG. 6 the exit plane 40 is actually as close as possible to the apex of the reflector 74. Furthermore the inner circle of the cross-section 75 is smaller than is shown in the Figure. Finally, the annular lens has a maximum possible dimension in the direction of the principal axis 00' so that a maximum quantity of radiation is received.

We claim:

1. A low-throughput illumination system for emitting radiation along a principal axis of said system, comprising:
    a radiation source;
    condenser means, positioned in relation to said radiation source so as to receive source radiation from at least two different directions, for forming at least two radiation beams;
    first reflector means, positioned in the paths of said at least two radiation beams, for reflecting said at least two radiation beams towards the principal axis; and
    second reflector means, positioned at a location where said at least two radiation beams would otherwise intersect one another after reflection by said first reflector means, for reflecting said at least two radiation beams towards the principal axis so that the beams have their narrowest constriction in an exit plane of the system located proximate to the second reflector means, are separated from one another and are located substantially symmetrically with respect to the principal axis.

2. An illumination system as claimed in claim 1, further comprising a lens arranged at the exit of the illumination system for converging the axes of the at least two radiation beams to a point on a surface which must be illuminated and for superimposed imaging of the pupils of the condenser means in said surface.

3. An illumination system as claimed in claim 1 or 2, wherein said condenser means includes at least two lens elements, with at least one refractive surface of each lens element being aspherical.

4. An illumination system as claimed in claim 3, wherein each lens element is succeeded by at least one extra lens element.

5. An illumination system as claimed in claim 1, further comprising at least one reflector arranged in the path of each of the beams between the first reflector means and the second reflector means.

6. An illumination system as claimed in claim 1, wherein said condenser means includes two lens elements arranged on a front side of the radiation source facing the exit of the system, the optical axes of said lens elements intersecting each other in the center of the radiation source at an angle which is smaller than 90°;
    said illumination system further comprises a concave reflector arranged on the rear side of the radiation source, which reflector reflects the radiation emerging from the rear side of the radiation source toward the condenser means, and wherein the second reflector means includes a roof mirror having an apex angle which is smaller than 90° and whose apex faces the exit of the illumination system, and wherein the cross-section in the system exit plane of the beams formed by the condenser means and the first and second reflector means are located on different sides of a plane through the principal axis and transversely to the longitudinal direction of the radiation source.

7. An illumination system as claimed in claim 1, wherein said condenser means includes four lens elements arranged symmetrically around the radiation source, the optical axes of said lens elements intersecting one another in the center of the radiation source, wherein said second reflector means includes a pyramid-shaped mirror and wherein the cross-sections in the exit plane of the four beams formed by the condenser means and the first and second reflector means are located in four different quadrants of the exit plane.

8. An illumination system as claimed in claim 1, wherein said condenser means includes an annular lens encircling said radiation source and forming an annular radiation beam, wherein the first reflector means includes an annular reflector and the second reflector means includes a cone-shaped reflector, and wherein the beam formed by the condenser means and first and second reflector means has an annular cross-section at the area of the exit plane, which cross-section is centered with respect to the principal axis.

9. A projection device comprising an illumination system as claimed in any of claims 1, 2, 6, 7, or 8, further comprising:
information display means including at least one display panel for generating images to be projected;
projection lens means for projecting said images on a screen, and
an output lens for superposed imaging of the pupils of the condenser means of the illumination system on the information display panels.

10. A color projection device having three channels for the three primary colors, red, green and blue, each color channel comprising a separate display panel, comprising:
an illumination system as claimed in any one of claims 1, 2, 6, 7, or 8 and further comprising means for supplying separate beams for the three color channels via color-splitting means.

* * * * *